Feb. 6, 1968 P. W. DOWDING ET AL 3,368,083

SILICON CONTROLLED RECTIFIER SHIFT REGISTER OR RING COUNTER

Filed Aug. 10, 1965 2 Sheets-Sheet 1

Feb. 6, 1968 P. W. DOWDING ETAL 3,368,083

SILICON CONTROLLED RECTIFIER SHIFT REGISTER OR RING COUNTER

Filed Aug. 10, 1966 2 Sheets-Sheet 2

INVENTORS
Peter W. Dowding and
Clifford Hardcastle.
BY
W. L. Stout
THEIR ATTORNEY United States Patent Office 3,368,083

Patented Feb. 6, 1968

3,368,083
SILICON CONTROLLED RECTIFIER SHIFT REGISTER OR RING COUNTER

Peter William Dowding and Clifford Hardcastle, London, England, assignors to Westinghouse Brake and Signal Company Limited, London, England Filed Aug. 10, 1965, Ser. No. 478,682
15 Claims. (Cl. 307—221)

ABSTRACT OF THE DISCLOSURE

This invention relates to a counting circuit including a plurality of stages in any one sequence of operations of which a first predetermined state is stepped successively from one stage to the next stage via a coupling device on application of a stepping signal to the one stage. The reception of the stepping signal to the one stage is conditioned upon the one stage being in a first predetermined state, the first predetermined state being stepped to the next stage conditionally upon a stage previous to the one stage first noted having been altered from a first predetermined state to a second predetermined state.

Novelty resides in utilizing a saturable transformer as a coupling device, the transformer being saturated when a previous stage is in a first state and the transformer being in an unsaturated condition which will permit a signal transfer between stages only when the previous stage is in a second predetermined state.

This invention relates to counting circuits in which signals to be counted are transferred through a plurality of stages only upon the occurrence of a set of conditions that thereby establishes a fail-safe counting circuit arrangement.

More specifically, this invention relates to a counting circuit including a plurality of stages in any one sequence of operations of which a first predetermined state is stepped successively from one stage to the next stage via a coupling device on application of a stepping signal to the one stage. The reception of the stepping signal to the one stage is conditioned upon the one stage being in a first predetermined state, the first predetermined state being stepped to the next stage conditionally upon a stage previous to the one stage first noted having been altered from a first predetermined state to a second predetermined state.

It is therefore a principal object of this invention to provide a counting circuit that has the fail-safe feature of preventing a counting signal transfer beyond a stage where there has been a component failure, short circuit or open circuit.

Another object of this invention is to provide a circuit arrangement that may be readily utilized as a counter, ring counter or shift register device.

Still another object of this invention is to provide a counting circuit that uniquely answers the need for fail-safe operation in a railway signaling environment.

In the attainment of the foregoing objects there is utilized a plurality of stages, which stages each have first and second controlled rectified devices all of which are electrically connected to a common electrical connection.

Disposed between each of the stages is a stage coupling device electrically connected to the second controlled rectifier device of the immediately preceding adjacent stage and the first controlled rectifier device of the adjacent succeeding stage. In addition, the stage coupling device is electrically connected to the first controlled rectifier device of the next preceding stage, the stage coupling device being controlled to prevent a signal transfer to the succeeding stage whenever the first controlled rectifier device of the next preceding stage is conducting. A signal transfer between stages occurs only when the first controlled rectifier device of the next preceding stage is nonconducting and the second controlled rectifier of the preceding stage is conducting. Each controlled rectifier device has connected thereto a conductor cutoff means in the form of a capacitor, which capacitor discharges through its respective controlled rectifier device when the controlled rectifier devie is initially conducting. This capacitor discharge serves the control function of cutting off conduction by any of the remaining controlled rectifier devices should the remaining controlled rectifier devices be conducting when any one of the controlled rectifier devices becomes initially conducting. In addition, there is provided a controlled rectifier enabling means in the form of a diode connected respectively to the first controlled rectifier and the second controlled rectifier of each stage. Each of these diodes is normally biased to be nonconducting when the first controlled rectifier is nonconducting and the diode has its bias removed and is conducting when the first controlled rectifier is rendered conducting. A stepping signal pulse source is connected to each diode or controlled conductor enabling means to allow passage of a stepping signal pulse to the second controlled rectifier through the diode whenever the first controlled rectifier device of any stage is conducting.

Finally there is a conditioning means connected to one of the first controlled rectifier devices of one of the first stages and to the stepping signal pulse source to trigger the first controlled rectifier device just mentioned into conduction, thereby activating the capacitor conductor cutoff means connected thereto and simultaneously controlling the stage coupling means to prevent a signal transfer between stages to the first controlled rectifier device of the next stage until the controlled conductor enabling diode of this first stage has received a stepping signal pulse. This results in the second controlled rectifier device of the first stage being rendered conducting, which conduction in turn controls the conductor cutoff capacitor connected to the second controlled rectifier device of the first stage to thereby render said first controlled rectifier device nonconducting. This results in a transfer of a stepping signal pulse to the next stage through the stage coupling means.

In carrying out the invention there is employed as a stage coupling device a transformer having a first and a second primary winding, which transformer has a core of material having a substantially square loop hysteresis characteristic. The core is saturated in a first direction by current from the first primary winding, the current being drawn by the first controlled rectifier device of the next preceding stage. This current through the first primary coil is drawn by the first controlled rectifier device of the next preceding stage only when that first controlled rectifier device is conducting. The core is saturated in the opposite direction by a further current in the second primary winding when no current is present in the first primary winding. The just noted further current is drawn by a second controlled rectifier device which is connected to the second primary coil of the stage coupling device when this second controlled conductor means is triggered into conduction upon receiving a stepping signal pulse.

Other objects and advantages of the present invention will become apparent from the ensuing description of illustrative embodiments thereof, in the course of which reference is had to the accompanying drawings, in which.

A description of the above embodiments will follow and then the novel features of the invention will be presented in the appended claims.

This invention employs the use of silicon controlled rectifier devices (SCR) which are characterized by the fact that such a device will sustain a voltage applied between its anode and cathode indefinitely until a suitable current is applied to the triggering gate of the device to trigger it into conduction. Once conducting, the SCR device will remain in conduction at a current as low as its holding current, even with no gate drive. To turn the SCR device off, the current through the device must be reduced to a value below the holding current for a significant length of time, or the forward bias must be removed for a similar length of time.

Figure 1:
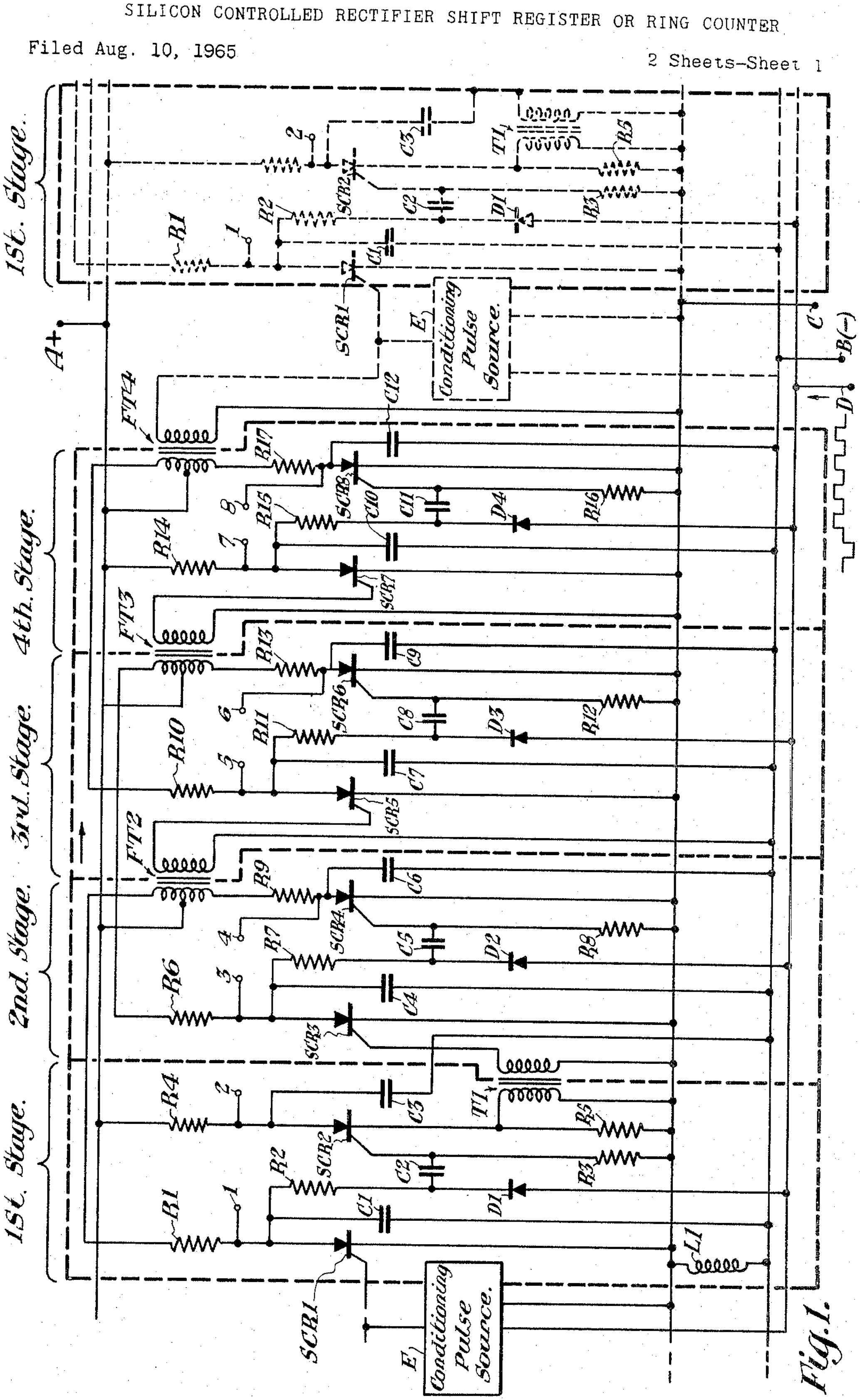
FIG. 1 is a circuit diagram illustrating one embodiment of the invention.

The counting circuit shown in FIG. 1 comprises a chain of four stages, the first stage being formed by controllable rectifier devices SCR1 and SCR2 with associated circuit components, the second stage comprising controllable rectifier devices SCR3 and SCR4 with associated components, the third stage comprising controllable rectifier devices SCR5 and SCR6 with associated components, and the fourth stage comprising controllable rectifier devices SCR7 and SCR8 with associated components. Common to all the stages in the chain are supply lines along the chain, the first two lines indicated by references A and B being the positive and negative supply lines, respectively, and the second two lines indicated by references C and D being the supply lines for the application of stepping signals to the train. The stepping signals comprise positive going pulses on the line D relative to the line C. The anode of the controllable rectifier device SCR1 of the first stage is connected via a resistor R1 and one half of the primary winding of the transformer FT2, to the line A. Similarly, the controllable rectifier device SCR3 of the second stage has its anode connected via a resistor R6 and one half of the primary winding of the transformer FT3, to the line A. Again, the first controllable rectifier device SCR5 of the third stage has its anode connected via a resistor R10 to the line A via one half of transformer FT4. Finally, the first controllable rectifier device SCR7 of the fourth stage has its anode connected via a resistor R14 directly to the line for reasons to be explained hereafter. The transformers FT2, FT3 and FT4 are transformers wound on cores of substantially square loop hysteresis material and, as will be seen hereafter, these transformers form couplings between successive stages and provide for safety requirements to be explained in more detail hereafter.

Since this invention is to be described in its embodiment of a four-stage ring counting device with only the output of the last stage being delivered to the first stage with no additional coupling to the first stage from the fourth stage, this will necessitate a coupling between the first stage and the second stage. The coupling between the first stage and the second stage is made via a transformer T1 having a core of soft iron material and the primary of which is connected to the cathode of device SCR2. The secondary winding of transformer T1 is connected to the trigger electrode of the controllable rectifier device SCR3. The triggering electrodes of the second controllable rectifier devices in each stage, namely, SCR2, SCR4, SCR6 and SCR8, are coupled to the stepping signal supply line D via respective diodes D1, D2, D3 and D4 and respective differentiating circuits comprising C2 and R3, C5 and R8, C8 and R12, and C11 and R16. These diodes D1 through D4 will be considered hereafter as controlled conductor enabling means since each one of these diodes is connected respectively to the second silicon controlled rectifier of each stage, and these second controlled rectifiers of each stage will not conduct until the associated diode has its bias removed and a stepping signal is applied via the diode to the second controlled rectifier. The diodes D1, D2, D3 and D4 are arranged to be reverse biased when controllable rectifier devices SCR1, SCR3, SCR5 and SCR7 are respectively non-conducting by the provision of connections between the anodes of these devices via resistors R2, R7, R11 and R15, respectively, to the cathodes of the respective diodes. In addition, for the purpose of achieving turnoff of the respective controllable rectifier devices, there is provided between the line B and the line C an inductance L1 to ensure that when a particular capacitor discharges through a controllable rectifier device, the potential of the line C rises to a value for a sufficient length of time to turn off all controllable rectifier devices in the circuit except the one through which the particular capacitor discharges. These capacitors C1, C3, C4, C6, C7, C10 and C12 will be referred to hereafter as controlled conductor cutoff means. The function of these devices in relationship to the rest of the circuit will be explained in detail more fully hereafter.

In operation of the circuit arrangement, initially the circuit is unresponsive to any of the pulses applied to line D since all the diodes D1, D2, D3 and D4 are reverse biased, and therefore unable to transmit the pulses to the triggering electrodes of the controllable rectifier devices SCR2, SCR4, SCR6 or SCR8. An application, however, of a conditioning pulse to the controllable rectifier device SCR1 from a conditioning pulse source E causes rectifier device SCR1 to become conducting and thereby remove the bias from the diode D1. The conditioning pulse source E may be a Schmitt trigger which has received a negative signal. The signal is shaped, inverted and delivered as a positive pulse to the trigger electrode of device SCR1. In addition, when rectifier SCR1 becomes conducting, capacitor C1 discharges through rectifier SCR1 to line C where this capacitor discharge from capacitor C1 will function to turn off all the other rectifiers SCR2 through SCR8 which are connected to line C, should any of these rectifiers be conducting at the time the conditioning pulse from conditioning pulse source E appears. The function of this capacitor discharge from capacitor C1 will be explained in more detail hereafter. Hence, the next positive going pulse appearing on the stepping signal line D is transmitted as a triggering pulse to the controllable rectifier device SCR2 of the first stage through diode D1 and condenser C2 of the counting circuit, and this controllable rectifier SCR2 is thereby rendered conducting. Upon rectifier SCR2 being rendered conducting, capacitor C3 discharges via rectifier SCR2, resistor R5 to line C, thence to the cathode of rectifier SCR1 opposing the current to rectifier SCR1 which is thereby rendered nonconducting. Since the primary winding of the transformer T1 is connected across resistor R5, which is in series with rectifier SCR2, on rectifier SCR2 becoming conducting, a positive impulse is applied to the other terminal of the primary winding of T1 and this is of correct polarity to be transposed into a triggering pulse in the secondary winding of T1 to render rectifier SCR3 also conducting. With rectifier SCR3 being conducting, along with rectifier SCR2, the charge stored in the capacitor C4 is discharged through rectifier SCR3 to the line C and thence appears on the cathode of rectifier SCR2 to oppose the flow of current in SCR2 which is thereby rendered nonconducting. The circuit is now in the position of having responded correctly to the application of the first stepping signal to the line D and the controllable rectifier SCR1 has been turned on and off again and controllable rectifier device SCR2 has been turned on and off accompanied by the turning on of rectifier SCR3, which thereby removes the bias on the diode D2. The second stage of the counting circuit is thereby conditioned to be responsive to the next stepping signal appearing on the line D.

It will be recalled that the coupling transformer FT2 has a core of material having a substantially rectangular hysteresis characteristic and when rectifier SCR1 is conducting it derives its current via half of the primary winding of this transformer. The transformer under these circumstances is saturated in one direction and is unable to provide any coupling between the second and third stages of the counting circuit. This is so, even though rectifier SCR4 may become conducting and thereby cause a current to pass through the lower half of the primary winding of transformer FT2 since a full excursion in the opposite direction of the flux will not have taken place.

Assuming therefore that the controllable rectifier device SCR1 is nonconducting and controllable rectifier device SCR3 is conducting, the next stepping signal appearing on line D will pass through diode D2 and capacitor C5 to render rectifier SCR4 conducting which in turn will allow capacitor C6 to discharge through rectifier SCR4 to line C, thence to the cathode of rectifier SCR3, turning rectifier SCR3 off, and the pulse induced in the secondary winding of transformer FT2 is transmitted to the triggering electrode of rectifier SCR5, which therefore also becomes conducting. The discharge of capacitor C7 via rectifier SCR5 to the line C and thence to the cathode of rectifier SCR4 turns rectifier SCR4 off. The fact that the controllable rectifier device SCR5 is now conducting means that the bias on diode D3 has been removed so that the controllable rectifier device SCR6 can be rendered conducting by the next stepping signal to appear on line D. The stepping signal will pass from line D through diode D3 and capacitor C8 to render SCR6 conducting. Here again, it will be recalled that the coupling transformer FT3 is similar to transformer FT2 in that the material of the core has a square loop hysteresis characteristic, and therefore unless rectifier SCR3 has been conducting and again nonconducting, no coupling is provided between the third stage of the counting circuit and subsequent stages. It will be seen therefore that the condition for the transmission of a pulse from the third stage to the fourth stage upon the apperance of the third stepping pulse on line D is that rectifier SCR3 is nonconducting and rectifier SCR5 is conducting when the third stepping signal pulse causes rectifier SCR6 to be rendered conducting.

When rectifier SCR6 becomes conducting, capacitor C9 discharges through rectifier SCR6 to line C and thence to the cathode of rectifier SCR5 to render rectifier SCR5 nonconducting. With rectifier SCR6 conducting and rectifier SCR5 nonconducting, the current through the primary coil of transformer FT3 causes a pulse to appear in the secondary coil of transformer FT3 and this will cause a pulse to appear at the triggering electrode of rectifier SCR7. This pulse renders rectifier SCR7 conducting which simultaneously removes the bias from the diode D4 and allows the discharge of capacitor C10 through rectifier SCR7 to the line C, thence to the cathode of rectifier SCR6 to render SCR6 nonconducting.

With the bias removed from diode D4 the fourth stage is now ready to respond to the presence of a fourth positive stepping pulse to line D. The appearance of this fourth positive stepping pulse on line D is transferred via the diode D4 and capacitor C11 to the trigger electrode or gate of rectifier SCR8 to thereby render rectifier SCR8 conducting. Upon rectifier SCR8 being rendered conducting the capacitor C12 discharges through the rectifier SCR8 to line C, thence to the cathode of the rectifier SCR7 to render SCR7 nonconducting. With rectifier SCR7 nonconducting and rectifier SCR8 conducting, a positive pulse will be caused to flow through the secondary of transformer FT4, which positive pulse may be directed to the triggering gate of rectifier SCR1 where the invention is utilized to form a ring counter. It is to be understood that while only four stages have been illustrated in this embodiment, the invention incorporated therein is readily applicable to any number of stages as long as the appropriate coupling between stages is provided by suitable transformers such as FT1 through FT4. In the embodiment illustrated in FIG. 1, in the right-hand portion thereof, there has been described and depicted the first stage of the counter in dotted lines to show the invention in a ring counter configuration. It should also be noted that since the fourth stage and the first stage are only coupled during a positive signal output from the secondary coil of transformer FT4 there is no need for the current flowing through rectifier SCR7 to pass through a transformer of the type that couples stages 1 through 4, and consequently the current to rectifier SCR7 comes directly from a connection made with the anode of rectifier SCR7 and the line A. Of course, if additional stages are added, the electrical lead to the anode of rectifier SCR7 would be linked with a primary coil of a succeding stage. In view of the electrical connection between the fourth stage and the first stage, it can be seen that when the invention described is in a ring counter configuration, once the rectifier SCR1 has been rendered conducting, the counting circuit continues to operate in response to stepping signals on the line D for as long as stepping signals are present and no fault occurs in the circuit. Of course, it goes without saying that the number of stages in the ring clearly depends upon the point from which a direct connection back to the first stage is made.

While not described heretofore, there may be employed a plurality of output terminals 1, 2, 3, 4, 5, 6, 7 and 8 connected to the lead of the anode of each of the controlled rectifier devices SCR1 to SCR8. When an output appears, for example, at terminal 1, this will be indicative of the fact that the first stage has been conditioned to receive a first stepping signal pulse. Accordingly, when an output appears at terminal 2 and the output of terminal 1 ceases, this situation is indicative of the first stage having received the first stepping signal pulse. The same is true with respect to each of the remaining pairs of controlled rectifiers in each of the stages.

In the event that the circuitry just described is to be utilized as a shift register then there would not be a connection between the fourth stage and the first stage. When the circuit is utilized as a shift register, the signals on line D will be comprised of both positive and negative pulses. The appearance of a negative pulse will cause the conditioning pulse source E to deliver a positive pulse, as noted earlier, to the trigger electrode of SCR1 which renders SCR1 conducting. At this time conductor cutoff capacitor C1 provides the important function of assuring a cutoff of any of the remaining controlled rectifiers SCR2 to SCR8. This cutoff function is accomplished when capacitor C1 discharges through controlled rectifier SCR1 to the line C and thence to the cathodes of the rectifiers SCR2 to SCR8 which are electrically connected to line C.

It is therefore seen that the circuit embodying the invention may be utilized both as a counting circuit, ring counter or shift register. All of these functions are also accompanied with a fail-safe capacity to be described more fully hereafter.

Figure 2:
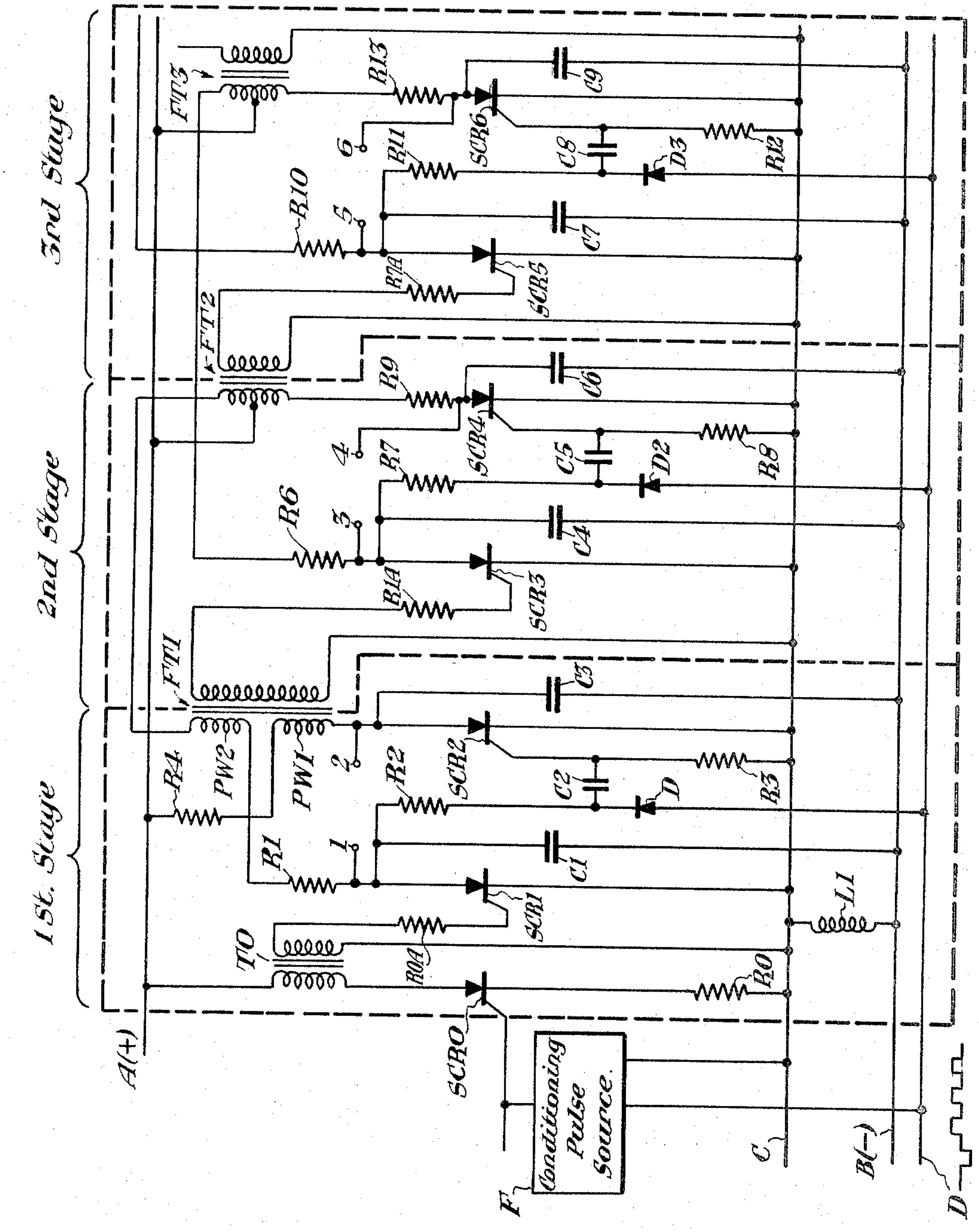
FIG. 2 is a circuit diagram depicting a second embodiment of the invention.

The circuit shown in FIG. 2 is similar to that shown in FIG. 1 and like references are used for like parts. In addition, however, there is provided a controllable rectifier device SCR0 in series with the primary winding of a transformer T0. The secondary winding of transformer T0 is connected to the trigger electrode of rectifier SCR1. There is also a transformer FT1 having a core having a square loop hysteresis characteristic. A first primary winding PW1 of transformer FT1 is connected in series with resistor R4 and rectifier SCR2. A second primary winding PW2 of transformer FT1 is wound in opposition to primary winding PW1 and connected in series with resistor R1 and rectifier SCR1. The secondary winding of transformer T0 is connected via a resistance R0A to a triggering electrode of rectifier SCR1.

In operation of the circuit arrangement shown in FIG. 2, initially the circuit is unresponsive to any pulses applied to the line D since all the diodes D1, D2, D3, etc. are reverse biased and therefore unable to transmit pulses to the triggering electrodes of the controllable rectifier devices SCR2, SCR4 or SCR6.

An application, however, of a conditioning pulse to the controllable rectifier device SCR0 from a conditioning pulse source F, causes rectifier SCR0 to become conducting and current flows from the line A through the primary coil of transformer T0, through rectifier SCR0 and resistor R0 to the line C. This conditioning pulse source F is of the same type as conditioning pulse source E depicted in FIG. 1. At the instant of conduction a pulse is induced in a secondary winding of transformer T0, which pulse is applied to the triggering electrode of rectifier SCR1, via a current limiting resistor R0A. Rectifier SCR1 therefore conducts and what may be regarded as positive flux is produced in the core of the square loop transformer FT1. The conduction of rectifier SCR1 also removes the bias from the diode D1 so that the next positive going pulse appearing on the stepping line D is transmitted as a triggering pulse to controllable rectifier device SCR2 on the first stage of the counting circuit and this device is rendered conducting. When rectifier SCR1 conducts, capacitor C1 discharges through rectifier SCR1 to the line C and thence through resistor R0 to the cathode of rectifier SCR0 to render rectifier SCR0 nonconducting. Upon conduction of rectifier SCR2, capacitor C3 discharges through rectifier SCR2 and renders rectifier SCR1 nonconducting. Hence, the applied magnetic field due to the current in primary winding PW2 returns to zero. Due to the high remanence of the core of transformer FT1 the magnetic flux therein ideally remains unaltered until the reverse magnetic field due to the current in transformer FT1 increases and reverses the resultant flux in the core. The reversal of the magnetic flux induces a signal in the secondary winding of transformer FT1. It will be appreciated that in order to reverse this flux the applied field in PW2 must be zero, that is, no current must be flowing in primary winding PW2. This condition can only be obtained when rectifier SCR1 is switched off. Hence for a pulse to be induced in the secondary winding of transformer FT2, rectifier SCR1 must have been turned on and then off and rectifier SCR2 must have been rendered conducting.

The pulse thus induced in the secondary winding of transformer FT2 is fed via a current limiting resistor R1A to the trigger electrode of rectifier SCR3.

The sequence of operation of this circuit thereafter is assumed as that of FIG. 1 from the instant at which the triggering electrode of rectifier SCR3 in FIG. 1 receives a triggering pulse. The circuit depicted in FIG. 2 of course includes only three stages but the commentary made with references to the four-stage counting circuit depicted in FIG. 1 is equally applicable to the counting circuit arrangement set forth in FIG. 2, and this circuit of FIG. 2 may be amplified and have stages added thereto in the same manner as the counting circuit illustrated in FIG. 1.

The counting circuits described in the foregoing are designed to be compatible with safety requirements such as may be present in a design of railway signaling equipment. Thus, for example, if a short circuit or alternatively an open circuit occurs in any one of the controllable rectifier devices in either circuit, the counting chain circuit only operates as far as the stage in which such a fault is present and thereafter ceases to operate. If, for example, the controllable rectifier device SCR3 in either FIG. 1 or FIG. 2 becomes an open circuit, clearly it is impossible for the bias to be removed from the diode D2 and the second stepping signal cannot therefore reach the device SCR4. Again, taking the case of the controllable rectifier device SCR4, if this device is either opened or short circuited, the appropriate flux changes required in transformer FT2 to provide coupling to render rectifier SCR5 conducting are not produced. Hence, either of the foregoing faults, which are examples of the most common types of faults which may occur in either circuit, renders the counting circuit inoperable past the second stage and corresponding considerations are also true of faults occurring in subsequent stages.

While the present invention has been illustrated and disclosed in connection with the details of illustrative embodiments thereof, it should be understood that those are not intended to be limitative of the invention as set forth in the accompanying claims.

Having thus described our invention, what we claim is:

1. A counting circuit including a plurality of stages, (a) each of said stages having first and second controlled conductor means, (b) stage coupling means for said stages, each of said stage coupling means electrically connected to a second controlled conductor means of a stage and a first controlled conductor of a succeeding stage, each of said stage coupling means electrically connected to a first controlled conductor means of a next preceding stage, (c) a controlled conductor enabling means for each stage electrically connected respectively to said first controlled conductor means and said second controlled conductor means, (d) a stepping signal pulse source electrically connected to each of said controlled conductor enabling means, said controlled conductor enabling means being controlled by said first controlled conductor means of each stage when said first controlled conductor means is conducting to pass a stepping signal pulse to said second controlled conductor means, said stepping signal pulse being transferred through said stage coupling means from said second controlled conductor means to the next stage only when said first controlled conductor means of said next preceding stage which controls said stage coupling means is nonconducting.

(e) said stage coupling means includes a transformer having a core of material having substantially square loop hysteresis characteristic which core is saturated in a first direction by said first controlled conductor means of said next preceding stage when said controlled conductor is conducting and is saturated in the opposite direction by said second controlled conductor connected thereto when said second controlled conductor is conducting.

2. The counting circuit of claim 1 including in combination a conductor cutoff means electrically connected to each of said controlled conductor means, each of said conductor cutoff means activated by its associated controlled conductor means to stop electrical conduction by said remaining controlled conductor means when said associated controlled conductor means is initially conducting.

3. The counting circuit of claim 2 including in combination means electrically connected to said first controlled conductor means of one of the first stages of said plurality of stages and to said stepping signal pulse source to trigger said one of said first controlled conductor means into conduction thereby activating said conductor cutoff means connected thereto and simultaneously controlling said stage coupling means to prevent a signal transfer between stages to said first controlled conductor means of the next stage until said controlled conductor enabling means has received a stepping pulse thereby rendering said second controlled conductor means conducting which conduction in turn controls said conductor cutoff means connected to said second controlled conductor means to render said first controlled conductor means nonconducting which results in a stepping signal transfer to the next stage through said stage coupling means.

4. A counting circuit as claimed in claim 1 wherein there is provided a primary winding on said transformer having one terminal connected to said second controlled conductor of one of said stages, another terminal connected to the first controlled conductor of the next previous stage and an intermediate tapping point connected to a current supply terminal such that magnetizing flux in opposite directions is produced by current drawn by said first controlled conductor means of the next preceding stage and said second controlled conductor of one of said stages, via said primary winding.

5. A counting circuit as claimed in claim 1 wherein stage coupling means includes a transformer having a first and second primary winding and a core of a material having a substantially square loop hysteresis characteristic, said core being saturated in a first direction by current from said first primary winding, said current being drawn by said first controlled conductor means of said next preceding stage, said current being drawn by said first controlled conductor of said next preceding stage only when said first controlled conductor is conducting, said core saturated in the opposite direction by a further current in said second primary winding when no current is present in said first primary winding, said further current being drawn by said second controlled conductor means connected to said stage coupling means when said second controlled conductor means is triggered into conduction upon receiving a stepping signal pulse.

6. A counting circuit as claimed in claim 1 wherein said first and second controlled conductors are controlled rectifier devices.

7. A counting circuit as claimed in claim 6 wherein said stepping signal is applied to said second controllable rectifier device in a stage to render said controllable rectifier device conducting, said controllable rectifier device then rendering said first controllable rectifier device nonconducting.

8. The counting circuit of claim 1 wherein said controlled conductor enabling means is a diode biased to be nonconducting until said first controlled conductor device is rendered conducting thereby removing said bias from said diode.

9. The counting circuit of claim 2 wherein said cutoff means is a charged capacitor which discharges through said controlled conductors to thereby control said remaining controlled conductor means to ensure that said remaining controlled conductor means are rendered nonconducting.

10. A counting circuit including a plurality of stages, (a) each of said stages having a first controlled conductor means and a second controlled conductor means each of said controlled conductor means electrically connected to a common electrical connection, (b) stage coupling means to electrically couple each of said stages, each of said stage coupling means electrically connected to a second controlled conductor means of a stage and a first controlled conductor of a succeeding stage, each of said stage coupling means electrically connected to a first conductor means of a next preceding stage and controlled by said first conductor means of said next preceding stage to thereby control the electrical coupling between said second conductor means and said first conductor means of said succeeding stage, (e) conductor cutoff means electrically connected to each of said controlled conductor means, each of said conductor cutoff means activated by its associated controlled conductor means to stop electrical conduction by said remaining controlled conductor means when said associated controlled conductor means is initially conducting, (d) a controlled conductor enabling means for each stage electrically connected respectively to said first controlled conductor means and said second controlled conductor means, (e) a stepping signal pulse source electrically connected to each of said controlled conductor enabling means, said controlled conductor enabling means being controlled by said first controlled means of each stage to allow passage of said stepping signal pulse to said second controlled conductor means of each stage when said first controlled conductor means is conducting, (f) conditioning means electrically connected to said first controlled conductor means of one of the first stages of said plurality of stages and to said stepping signal pulse source to trigger said one of said first controlled conductor means into conduction thereby activating said conductor cutoff means connected thereto and simultaneously controlling said stage coupling means to prevent a signal transfer between stages to said first controlled conductor means of the next stage until said controlled conductor enabling means has received a stepping signal pulse thereby rendering said second controlled conduction means conducting which conduction in turn controls said conductor cutoff means connected to said second controlled conductor means to render said first controlled conductor means nonconducting which results in a stepping signal transfer to the next stage through said stage coupling means, (g) said coupling means includes a transformer having a core of a material having a substantially square loop hysteresis characteristic, which core is saturated in a first direction by current flowing through said preceding stage from said source when said stage preceding said one stage is in said first predetermined state and said core is saturated in the opposite direction by said curent flowing through said one stage upon said one stage's reception of said stepping signal.

11. A counting circuit including a plurality of stages in any one sequence of operations of which a first predetermined state is stepped successively from one of said stages to a next succeeding stage, each of said stages being in either said first predetermined state or a second predetermined state, a current source electrically connected to each of said stages, a stepping signal source electrically connected to each of said stages, coupling means for said stages, each coupling means electrically connected to a stage next preceding said one stage, said one stage and to said next succeeding stage, said stepping of said first predetermined state from said one stage to said next succeeding stage being made through said coupling means upon reception by said one stage of a stepping signal from said stepping signal source, said reception of said stepping signal to said one stage occurring only when said one stage is in said first predetermined state, said first predetermined state being stepped to the next stage only when said stage preceding said one stage has changed from said first predetermined state to said second predetermined state, said stage coupling means including a transformer having first and second primary windings and a core of material having a substantially square loop hysteresis characteristic, said primary winding being serially interconnected with said second primary winding, said second winding electrically connected to said one stage and said first primary winding electrically connected to said previous stage, said core being saturated in a first direction by current in said first primary winding when said previous stage is in said first predetermined state, said current being drawn through said second primary winding to said one stage only when said one stage is in said first predetermined state thereby saturating in an opposite direction said core when no current is present in said first primary winding, said current through said second primary winding being drawn by said one stage upon reception of said stepping signal by said one stage to thereby step said first predetermined state of said one stage to the next stage.

12. A counting circuit as claimed in claim 11 wherein there is provided a primary winding on said transformer having one terminal connected to said one stage and another terminal connected to said previous stage, said primary winding having an intermediate tapping point connected to said current source such that magnetizing flux in opposite directions is produced by said currents drawn by said one stage and said previous stage through said primary winding.

13. A counting circuit as claimed in claim 11 wherein each stage includes first and second controllable rectifier devices each having anodes and triggering electrodes electrically interconnected, in the first predetermined state of a stage said first controllable rectifier device is in a conducting state and said second controllable rectifier device is in a nonconducting state and in said second predetermined state of a stage said second controllable rectifier device is conducting and said first controllable rectifier device is nonconducting.

14. A counting circuit as claimed in claim 13 wherein there is provided a control conductor cutoff means electrically connected to each of said first and second controllable rectifier devices so that upon application of a stepping signal to said second controllable rectifier device to render said controllable rectifier conducting in the respective stage said control conductor cutoff means connected to said second controllable rectifier device renders said first controllable rectifier device nonconducting.

15. A counting circuit as claimed in claim 13 wherein a resistance is connected between the anode of said first controllable rectifier device and the cathode of a diode, the anode of the diode in turn connected to said stepping signal source, said diode being connected in series with a capacitor to the triggering electrode of said second controllable rectifier device whereby in operation a stepping signal will be transmitted via said diode and said capacitor only to render said second controllable rectifier device conducting.

References Cited

UNITED STATES PATENTS

| | | | |
|---|---|---|---|
| 2,971,101 | 2/1961 | Hurst et al. | 307—88.5 |
| 3,021,450 | 2/1962 | Jiu | 315—84.5 |
| 3,071,700 | 1/1963 | Smith | 307—88.5 |

ARTHUR GAUSS, *Primary Examiner.*

S. D. MILLER, *Assistant Examiner.*